United States Patent [19]

Okibayashi et al.

[11] Patent Number: 4,650,985
[45] Date of Patent: Mar. 17, 1987

[54] IMAGE READOUT ELEMENT

[75] Inventors: Katsushi Okibayashi, Ikoma; Shohichi Katoh, Yamatokoriyama, both of Japan

[73] Assignee: Sharp Kabushiki Kaisha, Osaka, Japan

[21] Appl. No.: 670,869

[22] Filed: Nov. 13, 1984

[30] Foreign Application Priority Data

Nov. 22, 1983 [JP] Japan ............................. 58-219881

[51] Int. Cl.⁴ .......................................... H01J 40/14
[52] U.S. Cl. ............................................. 250/211 R
[58] Field of Search ................ 250/211 R, 211 J, 578

[56] References Cited

U.S. PATENT DOCUMENTS 4,570,076 2/1986 Hamano et al. ................ 250/211 R

Primary Examiner—Gene Wan
Attorney, Agent, or Firm—Birch, Stewart, Kolasch & Birch

[57] ABSTRACT

An image readout element of an image readout sensor for reading image information comprises an insulation substrate which transmits light, a pair of electrodes opposite to each other which are deposited on the substrate, and a photoconductive layer coated on the substrate and the pair of electrodes, the photoconductive layer comprising particles showing photoconductive characteristics and a resin material for dispersing and binding the photoconductive particles. There are provided a plurality of the sensor element in a single image readout sensor, and one of each pair of electrodes is arranged in parallel with one of the other pairs of electrodes.

15 Claims, 1 Drawing Figure

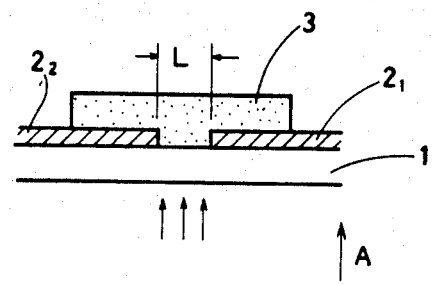

IMAGE READOUT ELEMENT

BACKGROUND OF THE INVENTION

The present invention relates to an image readout element and, more particularly, to a close-contact type one-dimensional image readout sensor employing a photoconductive layer composed of photoconductive particles such as cadmium Selenide (CdSe) binded by a resin material is opto-electric transducer elements.

One-dimensional image sensors, for example, CCD image sensors, MOS image sensors, close-contact type image sensors, etc. have been developed for an image reading device for, for example, a facsimile machine, an intelligent copier or the like.

In one-dimensional solid-state image sensors such as MOS image sensors and CCD image sensors, an image on an original document is projected through slits and the projected image is de-magnified on the image sensor elements so as to output image information signals relating to the document image.

Both the MOS image sensor and the CCD image sensor are formed on a monocrystal semiconductor substrate through the use of the IC (Integrated Circuit) technique. Therefore, a large size sensor is difficult to form. Accordingly, the MOS image sensor and the CCD image sensor are generally combined with an optical lens system so as to form de-magnified images on the image sensor elements. The optical lens system requires a predetermined long light-path which prevents the reduction of the size of the image reading apparatus. Furthermore, control of the optical lens system in the image readout sensor is complex, in that light amount is decreased at a circumferential portions of the image screen and the resolution of the image is therefore reduced.

To solve the optical path problem, the close-constant type image sensor has been proposed, which includes a light responsive member having a longitudinal size greater than or equal to the original document size in width. An image of the same size as the original document is formed on the light responsive member via an optical fiber lens array. The close-contact type image sensor needs a light responsive member having the same longitudinal size as the original document width and, a uniform photoconductive layer of a considerably large size must be formed.

A solid solution layer consisting of a Cadmium Sulfide (CdS) chemical deposit layer an Cadmium Selenide (CdSe), an amorphous silicon hydride (a-Si:H) layer and a Se-As-Te type amorphous layer produced by plasma C.V.D. have been proposed so as to form the large size photoconductive layer. However, the close-contact type image readout sensor employing one of the above photoconductive layers has several serious problems which prevent the image readout sensor element from showing sufficient characteristics. For example, the image sensor employing the CdS-CdSe solid solution photoconductive layer has a complicated construction which complicates the manufacturing process therefor. Furthermore, the reading speed is limited by the light response speed of the photoconductive layer because the light response speed of the CdS-CdSe solid solution photoconductive layer is slow, and the range of the brightness ratio between "light" and "dark" is narrow. In another image sensor employing the a-Si:H photoconductive layer, the levels of opto-electric signals outputted from the a-Si:H photoconductive layer are low. Furthermore, the manufacturing cost of the image sensor is high and a specific machine for manufacturing the image sensor is needed and is expensive.

SUMMARY OF THE INVENTION

Accordingly, it is an object of the present invention to provide an image readout element for an image readout sensor which overcomes the foregoing problems and improves photoconductive layer characteristics such as light responsiveness, output signal levels, S/N ratio, etc. to correctly accurately read image information through a photoconductive layer.

It is another object of the present invention to provide an image readout sensor element for an image readout sensor employing a photoconductive layer composed of photoconductive particles dispersed into and binded by a resin material.

It is still another object of the present invention to provide an image readout sensor element for a one-dimensional image readout sensor employing a resin dispersion type Cadmium Selenide (CdSe) photoconductive layer as an opto-electric transducer element.

It is still another object of the present invention to provide a one-dimensional close-contact type image readout sensor including a photoconductive layer member having a large longitudinal size greater than or equal to the width of an original document.

It is a further object of the present invention to provide a photoconductive layer composed of photoconductive particles binded by a resin material.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, an image readout element of an image readout sensor for reading image information comprises an insulation substrate which transmits light, a pair of electrodes opposite to each other which are deposited on the insulation substrate, and a photoconductive layer coated on the substrate and the pair of electrodes, the photoconductive layer comprising photoconductive particles composed of mainly Cadmium Selenide (CdSe) showing photoconductive characteristics and a resin material for dispersing and binding the photoconductive particles. There are provided a plurality of image readout sensor element in a single image readout sensor, and one of each pair of electrodes is arranged in parallel with one of the other pairs of electrodes. The photoconductive material of CdSe can be replaced by another photoconductive material which shows phtoconductive characteristics by being dispersed into and binded by a resin material. Such a material includes a II–VI compound such as CdS, ZnS, ZnSe, ZnO, HgS, HgSe, or HgTe, a III–V compound photoconductive material, or a IV photoconductive material.

BRIEF DESCRIPTION OF THE DRAWING

The present invention will be better understood from the detailed description given hereinbelow and the accompanying drawing which is given by way of illustration only, and thus is not limitative of the present invention and wherein:

The single FIGURE shows a sectional view of a close-contact type one-dimensional image readout sensor according to an embodiment of the present invention.

DETAILED DESCRIPTION OF THE INVENTION

The single FIGURE shows a sectional view of a close-contact type one-dimensionl image readout sensor according to an embodiment of the present invention.

A one-dimensional image readout sensor comprises a plurality of image readout sensor elements. Each of the image readout sensor elements comprises a substantially transparent insulation substrate 1 which transmits light, a pair of electrodes $2_1$ and $2_2$ made of aluminium (Al), and a photoconductive layer 3.

The Al electrodes $2_1$ and $2_2$ are formed with a distance "L" therebetween on the transparent insulation substrate 1. The distance L may be about 5 mm or less. The photoconductive layer 3 covers the end portions of the Al electrodes $2_1$ and $2_2$ which are opposite to each other and a space formed between the end portions of the Al electrodes $2_1$ and $2_2$, as wide as the readout area of the image readout sensor.

The one-dimensional arrangement of the image readout sensor is formed so that a plurality of the pairs of Al electrodes $2_1$ and $2_2$ are formed parallel on the transparent insulation substrate 1 with a constant pitch and that all of the pairs of electrodes $2_1$ and $2_2$ are covered with a band-like photoconductive layer 3 in common. An image on an original document is projected on the area of the distance "L" between each pair of opposite Al electrodes $2_1$ and $2_2$ by irradiating light under the transparent insulation substrate 1 in the direction A.

The plurality of pairs of electrodes $2_1$ and $2_2$ parallel to each other with a constant pitch are formed so that an aluminum layer of about 2000 Å in thickness is formed by evaporating with a mask and the evaporated Al layer is converted into comb-type electrodes with a density of about 10 electrodes/mm at the constant pitch of about 100 μm through the use of photolithography.

While CdSe particles of an average diameter from about 0.5 μm to about 5 μm, and preferably about 0.2 μm in the embodiment of the present invention, are dispersed into a resin material such as self-bridged thermosetting acrylic resin to produce a mixture liquid, the photoconductive layer 3 is formed on the transparent insulation substrate 1 in a thickness of about 100 μm by coating or printing the mixture liquid in a blade process. The thickness of the photoconductive layer 3 may be within a range from about 1 μm to about 200 μm.

The CdSe particles and the resin material may be mixed within an appropriate suitable ratio for outputting sufficient opto-electric signals from the photoconductive layer and keeping the binding strength between the photoconductive material and the resin material. Before the mixture liquid comprising the CdSe particles and the resin material is coated on the transparent insulation substrate 1, a suitable amount of toluene solvent is added into the mixture liquid for controlling the viscosity and the resultant liquid is agitated so as to obtain a dispersion liquid with good mixture between the CdSe particles and the resin material. After the dispersion liquid is further controlled by an ultrasonic dispersion device, the controlled dispersion liquid is coated or printed by a blade process on the transparent insulation substrate 1 and the evaporated Al electrodes $2_1$ and $2_2$.

The coated layer is dried and thermosetted at about 100 degrees C. for about 30 minutes and then at about 180 degrees C. for about 10 minutes in air so as to form the photoconductive layer having an uniform thickness.

The mixture ratio of the photoconductive material and the resin material can be selected according to the object of the photoconductive layer. However, when the weight percentage of the CdSe photoconductive material in the photoconductive layer is more than about 90 percent, the binding strength between the resin material and the CdSe photoconductive material is decreased and the photoconductive layer is weakened. When the weight percentage of the CdSe photoconductive material in the photoconductive layer is less than about 65 percent, the resistance of the photoconductive layer is increased, so that the output level of the signals relating to image information from the photoconductive layer becomes low, and at the same time, the light response speed of the photoconductive layer is limited since the mobility of carriers is decreased. Accordingly, the weight percentages of the CdSe photoconductive material in the photoconductive layer must be selected within the range from about 65 to about 90 percent. The most suitable weight percentage of the CdSe photoconductive material is about 80 percent.

In other words, the weight ratio between the photoconductive particles and the resin material may be within a range of 10:1–10:5.

The image readout sensors employing the photoconductive layer including the CdSe photoconductive material percent by weight of about 80 are manufactured and tested by the inventors. The one-dimensional image readout sensor exhibits good characteristics, for example, the light response speed is about 0.8 MsEc (an increase of 90 percent), the readout output is about 0.2 Volts across a load resistance of about 10 KΩ at about 200 lux radiation, the brightness ratio between "light" and "dark" is about 1100 ((bright output at 200 lux)/(dark output)) and variations of the image sensors fall within about 7 percent.

Although acrylic resin is used in the embodiment of the present invention as the resin material for dispersing and binding the photoconductive particles such as the CdSe particles because of a chemical resistance and easiness of handling, an organic material such as melanine resin, stylene resin, polyester resin, or silicon resin may be used as the resin material for binding and dispersing the CdSe photoconductive particles so as to obtain superior light output characteristics.

According to the present invention, the image readout sensor can be manufactured without missing superior photoconductive characteristics of CdSe particles. More particularly, the manufacturing process of the image readout sensor can be simplified, so that a long size image readout sensor can be made by a simplified manufacturing process and can output the high quality information relating to the image on the document.

The photoconductive layer 3 composed of the photoconductive material including mainly CdSe particles dispersed into and binded by the resin material may be used for another type of image readout sensor. It may be possible to add an addition into the photoconductive material beside the CdSe particles and the resin material, such as CdS particles, ZnS particles, ZnSe particles, CdTe particles, or ZnTe particles to be mixed with the CdSe particles.

Further, the material of CdSe can be replaced by another photoconductive material which shows photoconductive characteristics by being dispersed into and binded by a resin material, such as a II–VI compound photoconductive material such as CdS, ZnS, ZnSe, ZnO, HgS, HgSe, or HgTe, a III–V compound photoconductive material, or a IV photoconductive material. In such a case, the weight percentages between the particles and the resin binder, and their particle size may be the same degree as the CdSe case.

Although the electrode material may be selected according to the nature of the photoconductive material, the electrode material of Al can be replaced by another material showing a low resistance, such as Ti, Au, Ag, Cr, Ni, Pt, Sn, $SnO_2$, or Indium Tin Oxide (ITO).

The invention being thus described, it will be obvious that the same may be varied in many ways. Such variations are not to be regarded as a departure from the spirit and scope of the invention, and all such modifications are intended to be included within the scope of the following claims.

What is claimed is:

1. An image readout element of an image readout sensor for reading image information comprising:
   an insulation substrate which transmits light;
   a pair of electrodes opposite to each other which are deposited on the substrate; and
   a photoconductive layer coated on the substrate and the pair of electrodes, the photoconductive layer comprising,
   photoconductive particles having photoconductive characteristics; and
   a resin material for dispersing and binding the photoconductive particles, wherein the average diameter of the photoconductive particles is within a range from about 0.5 $\mu$m to about 5 $\mu$m.

2. The image readout element of claim 1, wherein the weight percentage of the photoconductive particles in the photoconductive layer is from about 65 to about 90 percent.

3. The image readout element of claim 1, wherein the photoconductive particle material is selected from the group of II–VI compounds including CdSe, CdS, ZnS, ZnSe, ZnO, HgS, HgSe, and HgTe.

4. The image readout element of claim 1, wherein the photoconductive particle material is selected from a group of III–V compounds.

5. The image readout element of claim 1 wherein the photoconductive particle material is selected from a group of IV substances.

6. The image readout element of claim 1, wherein the resin material is an organic material selected from the group of acrylic resin, melanine resin, stylene resin, polyester resin, and silicone resin.

7. The image readout element of claim 1, wherein the electrode material is selected from the group of materials including Al, Ti, Au, Ag, Cr, Ni, Pt, Sn, $SnO_2$, and ITO.

8. A photoconductive member for converting light into electrical signals comprising:
   particles having photoconductive characteristics; and
   a resin material for dispersing and binding the photoconductive particles, wherein the average diameter of the photoconductive particles is within a range from about 0.5 $\mu$m to about 5.0 $\mu$m.

9. The photoconductive member of claim 8, wherein the weight percentage of the photoconductive particles in the photoconductive member is from about 65 to about 90 percent.

10. The image readout element of claim 8, wherein the photoconductive particle material is selected from the group of II–VI compounds including CdSe, CdS, ZnS, ZnSe, ZnO, HgS, HgSe, and HgTe.

11. The image readout element of claim 8, wherein the photoconductive particle material is selected from a group of III–V compounds.

12. The image readout element of claim 8 wherein the photoconductive particle material is selected from a group of IV substances.

13. The image readout element of claim 8, wherein the resin material is an organic material selected from the group of acrylic resin, melanine resin, stylene resin, polyester resin, and silicone resin.

14. A photoconductive member for converting light into electrical signals comprising:
   photoconductive particles having photoconductive characteristics; and
   a resin material for dispersing and binding the photoconductive particles, the weight percentage of the photoconductive particles in the photoconductive member being from about 65 to about 90 percent, the average diameter of the photoconductive particles being within a range from about 0.5 $\mu$m to 5 $\mu$m.

15. An image readout element of an image readout sensor for reading image information comprising:
   an insulation substrate which transmits light;
   a pair of electrodes opposite to each other which are deposited on the substrate; and
   a photoconductive layer coated on the substrate and the pair of electrodes, the photoconductive layer comprising:
   photoconductive particles composed of mainly Cadmium Selenide (CdSe) having photoconductive characteristics; and
   a resin material for dispersing and binding the photoconductive particles, wherein the average diameter of the CdSe particles is within a range from about 0.5 $\mu$m to 5 $\mu$m and the weight percentage of the photoconductive particles in the photoconductive layer is from about 65 to about 90 percent.

* * * * *